(12) United States Patent
Samanta et al.

(10) Patent No.: US 10,818,540 B2
(45) Date of Patent: Oct. 27, 2020

(54) METHOD FOR TRANSFER OF A THIN LAYER OF SILICON

(71) Applicant: GlobalWafers Co. Ltd., Hsinchu (TW)

(72) Inventors: Gaurab Samanta, Brentwood, MO (US); Salvador Zepeda, St. Peters, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/420,637

(22) Filed: May 23, 2019

(65) Prior Publication Data

US 2019/0378753 A1 Dec. 12, 2019

Related U.S. Application Data

(60) Provisional application No. 62/682,228, filed on Jun. 8, 2018.

(51) Int. Cl.
*H01L 21/76* (2006.01)
*H01L 21/762* (2006.01)

(52) U.S. Cl.
CPC .......................... *H01L 21/76254* (2013.01)

(58) Field of Classification Search
CPC ................................................. H01L 21/76254
See application file for complete search history.

(56) References Cited

U.S. PATENT DOCUMENTS

| | | |
|---|---|---|
| 3,909,304 A | 9/1975 | Cho |
| 4,501,060 A | 2/1985 | Frye et al. |
| 4,755,865 A | 7/1988 | Wilson et al. |
| 4,968,384 A | 11/1990 | Asano |
| 5,189,500 A | 2/1993 | Kusunoki |
| 5,461,250 A | 10/1995 | Burghartz et al. |
| 5,773,355 A | 6/1998 | Shunsuke et al. |
| 6,043,138 A | 3/2000 | Ibok |
| 6,204,205 B1 | 3/2001 | Yu et al. |
| 6,271,144 B1 | 8/2001 | Monget et al. |
| 6,373,113 B1 | 4/2002 | Gardner et al. |
| 6,479,166 B1 | 11/2002 | Heuer et al. |
| 6,562,127 B1 | 5/2003 | Kud et al. |
| 6,562,703 B1 | 5/2003 | Maa et al. |
| 6,624,047 B1 | 9/2003 | Sakaguchi et al. |
| 7,018,882 B2 | 3/2006 | Tweet et al. |
| 7,459,374 B2 | 12/2008 | Aulnetta et al. |
| 7,868,419 B1 | 1/2011 | Kerr et al. |
| 7,879,699 B2 | 2/2011 | Schulze et al. |
| 7,915,716 B2 | 3/2011 | Pisigan et al. |
| 8,058,137 B1 | 11/2011 | Or-Bach et al. |

(Continued)

FOREIGN PATENT DOCUMENTS

| | | |
|---|---|---|
| EP | 0939430 A2 | 1/1999 |
| EP | 1865551 A2 | 12/2007 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

(Continued)

*Primary Examiner* — Matthew L Reames
(74) *Attorney, Agent, or Firm* — Armstrong Teasdale LLP

(57) ABSTRACT

A method for preparing semiconductor on insulator structures comprises transferring a thin layer of silicon from a donor substrate onto a handle substrate.

31 Claims, 5 Drawing Sheets

(56) References Cited

U.S. PATENT DOCUMENTS

| | | | |
|---|---|---|---|
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 9,425,081 | B2 | 8/2016 | Ben Mohamed et al. |
| 2002/0090758 | A1 | 7/2002 | Henley et al. |
| 2004/0003769 | A1 | 1/2004 | Tamatsuka et al. |
| 2004/0005740 | A1 | 1/2004 | Lochtefeld et al. |
| 2004/0031979 | A1 | 2/2004 | Lochtefeld et al. |
| 2004/0108537 | A1 | 6/2004 | Tiwari |
| 2004/0213907 | A1 | 10/2004 | Todd et al. |
| 2005/0026432 | A1 | 2/2005 | Atwater, Jr. et al. |
| 2005/0153524 | A1 | 7/2005 | Maa et al. |
| 2005/0167002 | A1 | 8/2005 | Ghyselen et al. |
| 2006/0030124 | A1 | 2/2006 | Maa et al. |
| 2006/0033110 | A1 | 2/2006 | Alam et al. |
| 2006/0046431 | A1 | 3/2006 | Blietz et al. |
| 2006/0063353 | A1 | 3/2006 | Akatsu |
| 2006/0226482 | A1 | 10/2006 | Suvorov |
| 2007/0032040 | A1 | 2/2007 | Lederer |
| 2007/0054466 | A1 | 3/2007 | Hebras |
| 2007/0200144 | A1 | 8/2007 | Aspar et al. |
| 2008/0171443 | A1 | 7/2008 | Hebras |
| 2008/0299744 | A1 | 12/2008 | Yamazaki et al. |
| 2009/0004833 | A1 | 1/2009 | Suzuki et al. |
| 2009/0014828 | A1 | 1/2009 | Mizushima et al. |
| 2009/0092810 | A1 | 4/2009 | Lee et al. |
| 2009/0117716 | A1 | 5/2009 | Shimomura et al. |
| 2009/0278233 | A1 | 11/2009 | Pinnington et al. |
| 2009/0321829 | A1 | 12/2009 | Nguyen et al. |
| 2011/0174362 | A1 | 7/2011 | Tanner et al. |
| 2011/0298083 | A1 | 12/2011 | Yoneda |
| 2012/0091587 | A1 | 4/2012 | Or-Bach et al. |
| 2012/0161310 | A1 | 6/2012 | Brindle et al. |
| 2012/0238070 | A1 | 9/2012 | Libbert et al. |
| 2012/0267681 | A1 | 10/2012 | Nemoto et al. |
| 2013/0092320 | A1 | 4/2013 | Argoud et al. |
| 2013/0120951 | A1 | 5/2013 | Zuo et al. |
| 2013/0122672 | A1 | 5/2013 | Or-Bach et al. |
| 2013/0168835 | A1 | 7/2013 | Botula et al. |
| 2013/0193445 | A1 | 8/2013 | Dennard et al. |
| 2013/0294038 | A1 | 11/2013 | Landru et al. |
| 2013/0344680 | A1 | 12/2013 | Arriagada et al. |
| 2014/0042598 | A1 | 2/2014 | Kitada et al. |
| 2014/0070215 | A1 | 3/2014 | Bedell et al. |
| 2014/0084290 | A1 | 3/2014 | Allibert et al. |
| 2014/0120654 | A1 | 5/2014 | Fujii et al. |
| 2014/0124902 | A1 | 5/2014 | Botula et al. |
| 2014/0273405 | A1 | 9/2014 | Liu et al. |
| 2015/0004778 | A1 | 1/2015 | Botula et al. |
| 2015/0104926 | A1 | 4/2015 | Libbert et al. |
| 2015/0115480 | A1 | 4/2015 | Peidous et al. |
| 2015/0112308 | A1 | 7/2015 | Peidous |
| 2016/0108551 | A1 | 4/2016 | Basak et al. |
| 2017/0033002 | A1 | 2/2017 | Meguro et al. |
| 2017/0256442 | A1 | 9/2017 | Kweskin et al. |
| 2017/0345663 | A1 | 11/2017 | Ishizuka et al. |
| 2019/0074215 | A1 | 3/2019 | Ecarnot et al. |

FOREIGN PATENT DOCUMENTS

| | | |
|---|---|---|
| EP | 2426701 A1 | 7/2012 |
| EP | 2503592 A1 | 9/2012 |
| EP | 2579303 A1 | 10/2013 |
| JP | H01315144 A | 12/1989 |
| JP | 2012253364 A | 12/2012 |
| WO | 2009120407 A2 | 10/2009 |
| WO | 2012127006 A1 | 9/2012 |
| WO | 2015112308 A1 | 7/2015 |
| WO | 2015119742 A1 | 8/2015 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q. Y. et al., Semiconductor wafer bonding: recent developments, Materials Chemistry and Physics, Mar. 1994, pp. 101/127, vol. 37, No. 2, Elsevier Sequoia.

Porrini, M. et al., Growth of Large Diameter High purity Silicon Single Crystals With the MCZ Method for Power Devices Applications, MADEP, Symposium on Materials and Devices for Powerelectronics, EPE Europen Conference on Power Electronics and Applications, Sep. 2, 1991, pp. 90-93.

Duo, Xinzhong et al., Evolution of hydrogen and helium co-implanted single-crystal silicon during annealing, Journal of Applied Physics, Oct. 15, 2001, vol. 90, No. 8, pp. 3780-3786.

International Search Report and Written Opinion of the International Searching Authority regarding PCT/US2019/033807 dated Jul. 25, 2019; pp. 1-14.

METHOD FOR TRANSFER OF A THIN LAYER OF SILICON

CROSS REFERENCE TO RELATED APPLICATION(S)

This application claims the benefit of priority to U.S. provisional application Ser. No. 62/682,228, filed on Jun. 8, 2018, the disclosure of which is incorporated by reference as if set forth in its entirety.

FIELD OF THE INVENTION

The present invention generally relates to the field of semiconductor wafer manufacture. More specifically, the present invention relates to a method of transferring thin silicon layers from a donor substrate to a handle substrate in the manufacture of silicon-on-insulator structures.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

SUMMARY OF THE INVENTION

The present invention is directed to a method of transferring a silicon layer from a single crystal silicon donor substrate to a handle substrate, the method comprising: (a) implanting $H_2^+$ ions, $H^+$ ions, or a combination of $H_2^+$ ions and $H^+$ ions through a silicon dioxide layer in contact with a front surface of the single crystal silicon donor substrate and through the front surface of the single crystal silicon donor substrate, the single crystal silicon donor substrate comprising two major, parallel surfaces one of which is the front surface and one of which is the back surface, a circumferential edge joining the front surface and the back surface, a central plane between the front surface and the back surface, a central axis perpendicular to the front surface, and a bulk region between the front surface and the back surface; (b) implanting $He^+$ ions through the silicon dioxide layer in contact with the front surface of a single crystal silicon donor substrate and through the front surface of the single crystal silicon donor substrate; (c) annealing the ion implanted single crystal silicon donor substrate at a temperature and for a duration sufficient to form a damage layer in the single crystal silicon donor substrate; (d) bonding the silicon dioxide layer in contact with the front surface of the single crystal silicon donor substrate to a dielectric layer in contact with the handle substrate to thereby prepare the multilayer substrate; (e) annealing the multilayer substrate; and (f) cleaving the annealed multilayer substrate at the damage layer in the single crystal silicon donor substrate to thereby transfer the silicon layer having a thickness between about 500 Angstroms and about 2500 Angstroms from the single crystal silicon donor substrate to the handle substrate.

Other objects and features will be in part apparent and in part pointed out hereinafter.

DETAILED DESCRIPTION OF THE EMBODIMENT(S) OF THE INVENTION

A Fully Depleted Silicon-on-Insulator (FD-SOI) structure relies on an ultra-thin layer of silicon over a Buried Oxide layer (BOX). The buried oxide layer may be of conventional thickness (on the order of 100 to 200 nanometers) or it may also be ultra-thin, for example, between 10 to 25 nm. The very thin silicon layer enables the silicon under the transistor gate (the body of the transistor) of a CMOS device to be fully depleted of charges. The present invention is therefore directed to a method of transferring very thin silicon layers from a donor substrate to a handle substrate.

According to the present invention, a method is provided for preparing a semiconductor-on-insulator composite structure (SOI, e.g., a silicon-on-insulator composite structure) having a relatively thin silicon device layer. In some embodiments, the SOI structure further comprises a relatively thin dielectric layer, e.g., a buried oxide layer. In some embodiments, the present invention is therefore directed to a method of transferring thin silicon layers of thickness between about 500 angstroms and about 2500 angstroms from a donor substrate onto a handle substrate. According to some embodiments of the present invention, Hydrogen ($H_2^+$ and/or $H^+$) ions and Helium ($He^+$) ions are co-implanted into the donor substrate at low ion energies. Annealing the co-implanted donor substrate forms a damage layer in the donor substrate. The depth of the damage layer determines the thickness of the layer of silicon transferred onto the handle substrate.

In order to achieve thin layer transfer, the implantation energies of the gaseous ions are kept low, especially when the oxide layer thickness on the donor wafer is also thin (e.g., a few hundred Angstroms). Transfer of a thin silicon device layer enables preparation of fully-depleted SOI structures (FD-SOI). Low power, high performance CMOS applications based on FD-SOI require the thickness of the silicon device layer and the thickness of the buried oxide layer be limited. Thin layers may be transferred by limiting the beam energy during ion implantation. Further, according to some embodiments, the manufacturing costs of production are further reduced by reducing the implantation dosages.

I. Semiconductor Donor Substrate and Semiconductor Handle Substrate

The substrates for use in the present invention include a semiconductor donor substrate, e.g., a single crystal semiconductor donor wafer, and a semiconductor handle substrate, e.g., a single crystal semiconductor handle wafer. The semiconductor device layer in a semiconductor-on-insulator composite structure is derived from the semiconductor donor substrate.

Figure 1A:
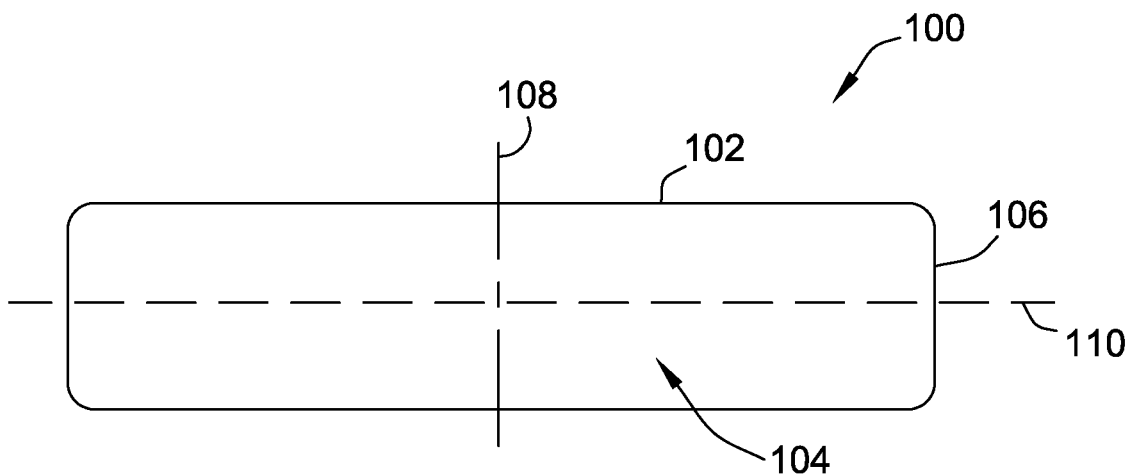
FIGS. 1A through 1F depict a process flow according to some embodiments of the present invention.
Figure 1B:
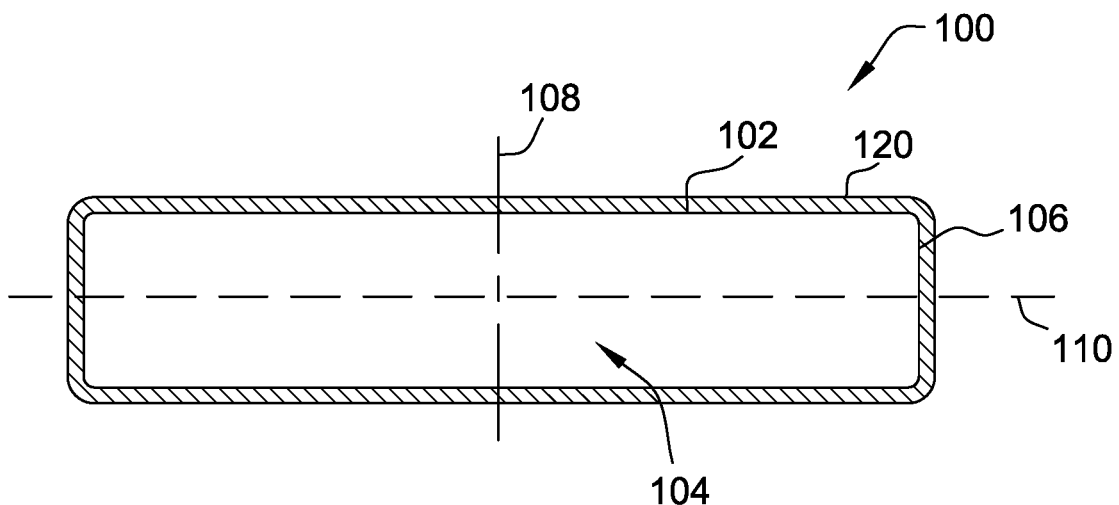

FIGS. 1A through 1F depict a process flow according to some embodiments of the present invention. With reference to FIG. 1A, an exemplary, non-limiting semiconductor donor substrate 100, e.g. a single crystal semiconductor donor wafer, is depicted. In general, the single crystal semiconductor donor substrate 100 comprises two major, generally parallel surfaces. One of the parallel surfaces is a front surface 102 of the single crystal semiconductor donor substrate 100, and the other parallel surface is a back surface 104 of the single crystal semiconductor donor substrate 100. The single crystal semiconductor donor substrate 100 comprises a circumferential edge 106 joining the front and back surfaces 102, 104. The single crystal semiconductor donor substrate 100 comprise a central axis 108 perpendicular to the two major, generally parallel surfaces 102, 104 and also perpendicular to a central plane 110 defined by the points midway between the front and back surfaces 102, 104. The single crystal semiconductor donor substrate 100 comprises a bulk region between the two major, generally parallel surfaces 102, 104. Since semiconductor wafers, e.g., silicon wafers, typically have some total thickness variation (TTV), warp, and bow, the midpoints defining the central plane 110 between every point on the front surface 102 and every point on the back surface 104 may not precisely fall within a plane. As a practical matter, however, the TTV, warp, and bow are typically so slight that to a close approximation the midpoints can be said to fall within an imaginary central plane 110 which is approximately equidistant between the front and back surfaces 102, 104.

Prior to any operation as described herein, the front surface 102 and the back surface 104 of the single crystal semiconductor donor substrate 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor donor substrate 100 refers to the major surface of the substrate through which ions are implanted. The front surface becomes an interior surface of the bonded structure. Accordingly, a "back surface" of a single crystal semiconductor donor substrate 100 refers to the major surface that becomes an exterior surface of the bonded structure. Similarly, a "front surface" of a handle substrate refers to the major surface of the handle substrate that becomes an interior surface of the bonded structure, and a "back surface" of a handle substrate refers to the major surface that becomes an exterior surface of the bonded structure. Upon completion of conventional bonding and cleaving steps, the single crystal semiconductor donor substrate forms the semiconductor device layer of the semiconductor-on-insulator (e.g., silicon-on-insulator) composite structure.

The handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. Handle wafers may additionally comprise sapphire, quartz, or glass. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from between about 100 micrometers and about 5000 micrometers, such as between about 100 micrometers and about 1500 micrometers, such as between about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1 (5 parts water:1 part aqueous ammonium hydroxide (29% by weight):1 part aqueous hydrogen peroxide (30% by weight))/SC2 solution (6 parts water:1 part aqueous hydrochloric acid (37% by weight):1 part aqueous hydrogen peroxide (30% by weight)). In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor donor substrate 100 and the handle substrate may have any resistivity obtainable by the Czochralski or float zone methods. Accordingly, the resistivity of the single crystal semiconductor donor substrate 100 and the handle substrate is based on the requirements of the end use/application of the structure of the present invention. The resistivity may therefore vary from milliohm or less to megaohm or more. In some embodiments, the single crystal semiconductor donor substrate 100 is undoped. In some embodiments, the handle substrate 100 is undoped. In some embodiments, the single crystal semiconductor donor substrate 100 comprises a p-type or an n-type dopant. In some embodiments, the handle substrate 100 comprises a p-type or an n-type dopant. Suitable dopants include boron (p type), gallium (p type), aluminum (p type), indium (p type), phosphorus (n type), antimony (n type), and arsenic (n type). The dopant concentration is selected based on the desired resistivity of the single crystal semiconductor donor substrate.

In some embodiments, the single crystal semiconductor donor substrate 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor donor substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor donor substrate 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle wafer has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor donor substrate 100 may comprise single crystal silicon. The single crystal semiconductor donor substrate 100 may have any of (100), (110), or (111) crystal orientation, and the choice of crystal orientation may be dictated by the end use of the structure.

Optionally, the front surface 102, the back surface 104, or both surfaces of the single crystal semiconductor donor substrate 100 may be oxidized according to methods known in the art. Oxidation may be accomplished by means known in the art, such as thermal oxidation (in which some portion of the deposited semiconductor material film will be consumed), CVD oxide deposition, or by exposure to a standard cleaning solution, such as an SC1/SC2 cleaning solution. The single crystal semiconductor donor substrate 100 may be thermally oxidized in a furnace such as an ASM A400 or ASM A400XT. The temperature may range from 750° C. to 1100° C., such as between about 800° C. and about 1200° C., in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprises a mixture of inert gas, such as Ar or $N_2$, and oxidizing gases, such as $O_2$ and water vapor (a "wet oxidation"). In an exemplary embodiment, donor wafers may be loaded into a vertical furnace, such as an ASM A400 or ASM A400XT. The temperature is ramped to the oxidizing temperature with a mixture of $N_2$ and $O_2$. At the desired temperature water vapor is introduced into the gas flow. After desired oxide thickness has been obtained, the water vapor and $O_2$ are turned off and the furnace temperature is reduced and wafers are unloaded from the furnace. In embodiments wherein the single crystal semiconductor donor substrate 100 is a single crystal silicon donor substrate, the oxidation layer 120 comprises silicon dioxide. See FIG. 1B. The oxidation layer 120 on the front surface 102, the back surface 104, or both may be between about 100 angstroms and about 1000 angstroms, such as between about 100 angstroms and about 700 angstroms, or between about 100 angstroms and about 500 angstroms, or between about 100 angstroms and about 250 angstroms. I In some embodiments, the oxidation layer 120 is relatively thin, such as between about 5 angstroms and about 25 angstroms, such as between about 10 angstroms and about 15 angstroms. Thin oxide layers can be obtained on both sides of a semiconductor wafer by exposure to a standard cleaning solution, such as an SC1/SC2 cleaning solution. In some embodiments, the SC1 solution comprises 5 parts deioinized water, 1 part aqueous $NH_4OH$ (ammonium hydroxide, 29% by weight of $NH_3$), and 1 part of aqueous $H_2O_2$ (hydrogen peroxide, 30%). In some embodiments, the handle wafer may be oxidized by exposure to an aqueous solution comprising an oxidizing agent, such as an SC2 solution. In some embodiments, the SC2 solution comprises 5 parts deioinized water, 1 part aqueous HCl (hydrochloric acid, 39% by weight), and 1 part of aqueous $H_2O_2$ (hydrogen peroxide, 30%).

II. Ion Implantation

Figure 1C:
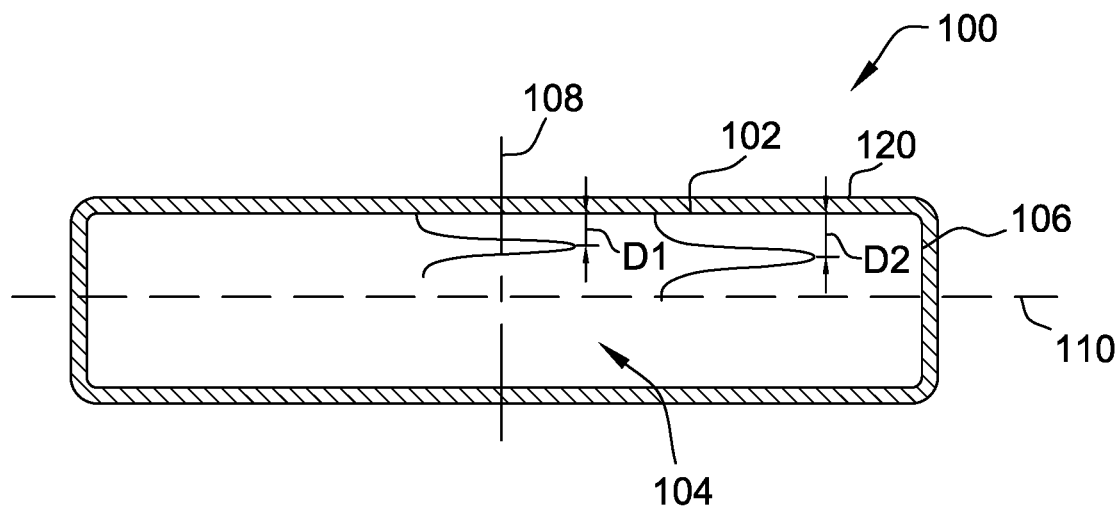
Figure 1D:
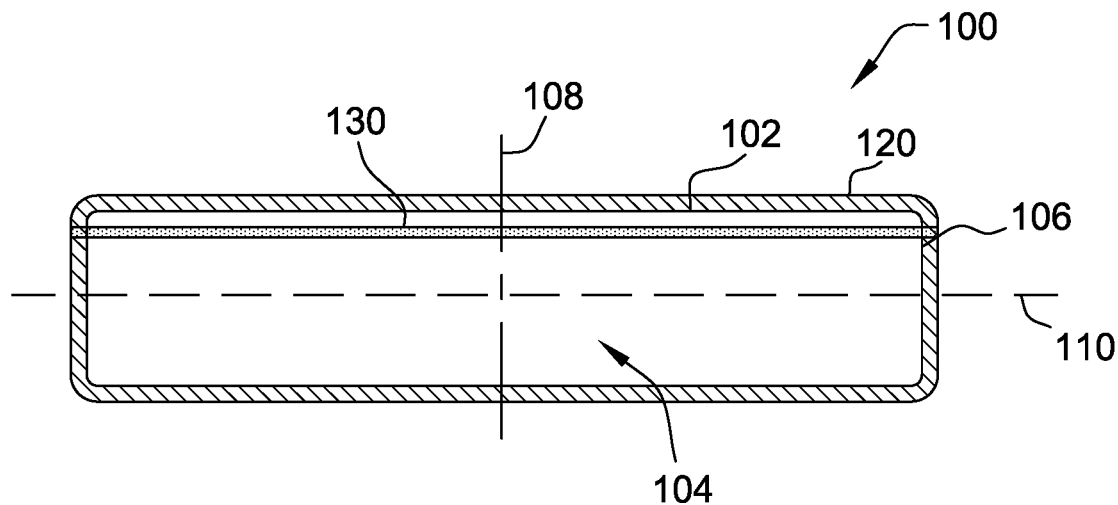

Ion implantation may be carried out in a commercially available instrument, such as an Applied Materials Quantum II, a Quantum LEAP, or a Quantum X. According to some embodiments, the implanted ions include a combination of $H^+$ and/or $H_2^+$ ions and $He^+$ ions. The $H^+$ and/or $H_2^+$ ions may be implanted before the $He^+$ ions implanted, after the $He^+$ ions implanted, or the $H^+$ and/or $H_2^+$ ions may be implanted simultaneously with the $He^+$ ions. Ion implantation is carried out at a density and duration sufficient to form a damage layer in the semiconductor donor substrate. With reference to FIG. 1C, ion implantation occurs through the oxidation layer 120 and the front surface 102 of the single crystal semiconductor donor substrate 100, such that the single crystal semiconductor donor substrate 100 comprises $H^+$ and/or $H_2^+$ ions at a peak depth (D1) and $He^+$ ions at a peak depth (D2). The peak depths, (D1) and (D2), are for illustration and are not to be considered to scale. The lengths of the peak depths, (D1) and (D2), are measured from the front surface 102 of the single crystal silicon donor substrate 100 and along the central axis 108. The depth of implantation determines the thickness of the single crystal semiconductor device layer in the final SOI structure.

In some embodiments, the method comprises implanting hydrogen ions (e.g., $H_2^+$, $H^+$ ions, or a combination of $H_2^+$ and $H^+$ ions) through the front surface of the monocrystalline donor substrate to an average depth (D1) as measured from the front surface toward the central plane. The average depth, (D1), of implanted hydrogen ions may range from about 100 Angstroms and about 4000 Angstroms, from about 100 Angstroms and about 3000 Angstroms, or between about 500 Angstroms and about 3000 Angstroms, or between about 500 Angstroms and about 2500 Angstroms, as measured from the front surface of the single crystal silicon donor substrate and along the central axis. In some embodiments, the $H_2^+$ ion implantation dosage may range from about $4.3 \times 10^{15}$ ions/cm$^2$ and about $1.1 \times 10^{16}$ ions/cm$^2$, or between about $6.8 \times 10^{15}$ ions/cm$^2$ and about $1.1 \times 10^{16}$ ions/cm$^2$, at an implant energy between about 10

Kev and about 40 Kev, such as between about 20 Kev and about 40 Kev, or between about 25 Kev and about 35 Kev, such as about 16 Kev or about 32 Kev. In some embodiments, the $H_2^+$ ion implantation dosage may range from about $4.3 \times 10^{15}$ ions/cm$^2$ and about $1.1 \times 10^{16}$ ions/cm$^2$, or between about $6 \times 10^{15}$ ions/cm$^2$ and about $1.1 \times 10^{16}$ ions/cm$^2$, at an implant energy between about 20 Kev and about 40 Kev, or between about 25 Kev and about 35 Kev, such as about 16 Kev or about 32 Kev. In some embodiments, the $H_2^+$ ion implantation dosage may range from about $5.9 \times 10^{15}$ ions/cm$^2$ and about $6.7 \times 10^{15}$ ions/cm$^2$ at an implant energy between about 10 Kev and about 30 Kev, such as between about 15 Kev and about 20 Kev, such as about 16 Kev. In some embodiments, the $H^+$ ion implantation dosage may range from about $5 \times 10^{15}$ ions/cm$^2$ and about $2 \times 10^{16}$ ions/cm$^2$ at an implant energy between about 5 Kev and about 20 Kev, such as between about 10 Kev and about 20 Kev, such as about 16 Kev. In some embodiments, the $H^+$ ion implantation dosage may range from about $1.1 \times 10^{16}$ ions/cm$^2$ and about $2 \times 10^{16}$ ions/cm$^2$ at an implant energy between about 5 Kev and about 20 Kev, such as between about 10 Kev and about 20 Kev, such as about 16 Kev. In some embodiments, the $H^+$ ion implantation dosage may range from about $6.1 \times 10^{15}$ ions/cm$^2$ and about $6.8 \times 10^{15}$ ions/cm$^2$ at an implant energy between about 5 Kev and about 20 Kev, such as between about 10 Kev and about 20 Kev, such as about 16 Kev. In some embodiments, a combination of $H_2^+$ and $H^+$ ions are implanted to an average depth (D1) as measured from the front surface toward the central plane within the above stated dosage ranges and energies.

In some embodiments, the method comprises implanting helium ions (e.g., $He^+$ ions) through the front surface of the monocrystalline donor substrate to an average depth (D2) as measured from the front surface 102 and along the central axis 108. The average depth, (D2), of implanted helium ions may range from about 100 Angstroms and about 4000 Angstroms, from about 100 Angstroms and about 3000 Angstroms, or between about 500 Angstroms and about 3000 Angstroms, or between about 500 Angstroms and about 2500 Angstroms, as measured from the front surface of the single crystal silicon donor substrate and along the central axis. In some embodiments, the total helium ion implantation dosage may range from about $6 \times 10^{15}$ ions/cm$^2$ and about $2 \times 10^{16}$ ions/cm$^2$, from about $6 \times 10^{15}$ ions/cm$^2$ and about $1.3 \times 10^{16}$ ions/cm$^2$, such from about $6.3 \times 10^{15}$ ions/cm$^2$ and about $1.1 \times 10^{16}$ ions/cm$^2$, from about $6.6 \times 10^{15}$ ions/cm$^2$ and about $8 \times 10^{15}$ ions/cm$^2$, at an implant energy between about 5 Kev and about 30 Kev, such as between about 10 Kev and about 25 Kev, or between about 15 Kev and about 25 Kev, such as about 22 Kev. In some embodiments, the total helium ion implantation dosage may range from about $6 \times 10^{15}$ ions/cm$^2$ and about $2 \times 10^{16}$ ions/cm$^2$, from about $6 \times 10^{15}$ ions/cm$^2$ and about $1.3 \times 10^{16}$ ions/cm$^2$, such from about $6.3 \times 10^{15}$ ions/cm$^2$ and about $1.1 \times 10^{16}$ ions/cm$^2$, from about $6.6 \times 10^{15}$ ions/cm$^2$ and about $8 \times 10^{15}$ ions/cm$^2$, at an implant energy between about 5 Kev and about 30 Kev, such as between about 10 Kev and about 25 Kev, or between about 15 Kev and about 25 Kev, such as about 22 Kev. In some embodiments, the total helium ion implantation dosage may range from about $6 \times 10^{15}$ ions/cm$^2$ and about $2 \times 10^{16}$ ions/cm$^2$, from about $6 \times 10^{15}$ ions/cm$^2$ and about $1.3 \times 10^{16}$ ions/cm$^2$, such from about $6.3 \times 10^{15}$ ions/cm$^2$ and about $1.1 \times 10^{16}$ ions/cm$^2$, from about $6.6 \times 10^{15}$ ions/cm$^2$ and about $8 \times 10^{15}$ ions/cm$^2$, or from about $6.6 \times 10^{15}$ ions/cm$^2$ and about $7 \times 10^{15}$ ions/cm$^2$ at an implant energy between about 5 Kev and about 20 Kev, such as between about 5 Kev and about 15 Kev, such as about 11 Kev.

Preferably, the peak density, (D1), of $H_2^+$ ions, $H^+$ ions, or a combination of $H_2^+$ ions and $H^+$ ions and the peak density, (D2), of $He^+$ ions are within about 1000 angstroms of each other, within about 600 angstroms of each other, or within about 500 angstroms of each other, within about 450 angstroms of each other, within about 400 angstroms of each other, within about 300 angstroms of each other, or within about 200 angstroms of each other.

In some embodiments it may be desirable to subject the single crystal semiconductor donor wafers, e.g., single crystal silicon donor wafers, to a clean after the implant. In some preferred embodiments, the clean could include a Piranha clean (mixture of sulfuric acid and hydrogen peroxide) followed by a DI water rinse and SC1 (mixture of water:aqueous ammonium hydroxide:aqueous hydrogen peroxide in 5:1:1 ratio) and SC2 (mixture of water:aqueous hydrochloric acid:aqueous hydrogen peroxide in 6:1:1 ratio) cleans.

III. Anneal

In some embodiments of the present invention, the ion implanted single crystal semiconductor donor substrate 100 is annealed at a temperature sufficient to form a thermally activated damage layer or cleave plane 130 in the single crystal semiconductor donor substrate. This anneal occurs before bonding. By utilizing low implantation energies, the damage layer 130 occurs at a depth that enables transfer of a thin silicon layer to the handle substrate, such as a thickness between about 500 Angstroms and about 2500 Angstroms.

An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 350° C., such as between about 250° C. and about 300° C. Thermal annealing may occur for a duration of from about 10 hours to about 10 hours, such as from about 10 minutes to about 2 hours, or between about 10 minutes and about 60 minutes. Thermal annealing within these temperatures ranges is sufficient to form a thermally activated cleave plane 130. After the thermal anneal to activate the cleave plane 130, the single crystal semiconductor donor substrate surface is preferably cleaned. In some preferred embodiments, the clean could include a Piranha clean (mixture of sulfuric acid and hydrogen peroxide) followed by a DI water rinse and SC1 (mixture of water:aqueous ammonium hydroxide:aqueous hydrogen peroxide in 5:1:1 ratio) and SC2 (mixture of water:aqueous hydrochloric acid:aqueous hydrogen peroxide in 6:1:1 ratio) cleans.

IV. Plasma Activation

In some embodiments, the ion-implanted and annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with an oxygen gas source and/or a nitrogen gas source in a carrier gas, such as argon, to a pressure less than atmospheric to thereby create the plasma. Oxygen and/or water are suitable source gases for plasma oxide treatment. Ammonia and/or nitrogen and/or nitric oxide (NO) and/or nitrous oxide ($N_2O$) gas are suitable source gases for plasma nitride treatment. Oxynitride plasma activation may include oxygen and nitrogen gas sources in the ambient atmosphere.

The single crystal semiconductor donor wafer is exposed to this plasma for the desired time, which may range from about 1 second to about 120 seconds. Oxygen or nitrogen plasma surface oxidation is performed in order to render the front surface of the single crystal semiconductor donor substrate hydrophilic and amenable to bonding to a handle substrate. After plasma activation, the activated surface is rinsed with deionized water. The wafer is then spun dry prior to bonding.

V. Preparation of the Bonded Structure

Figure 1E:
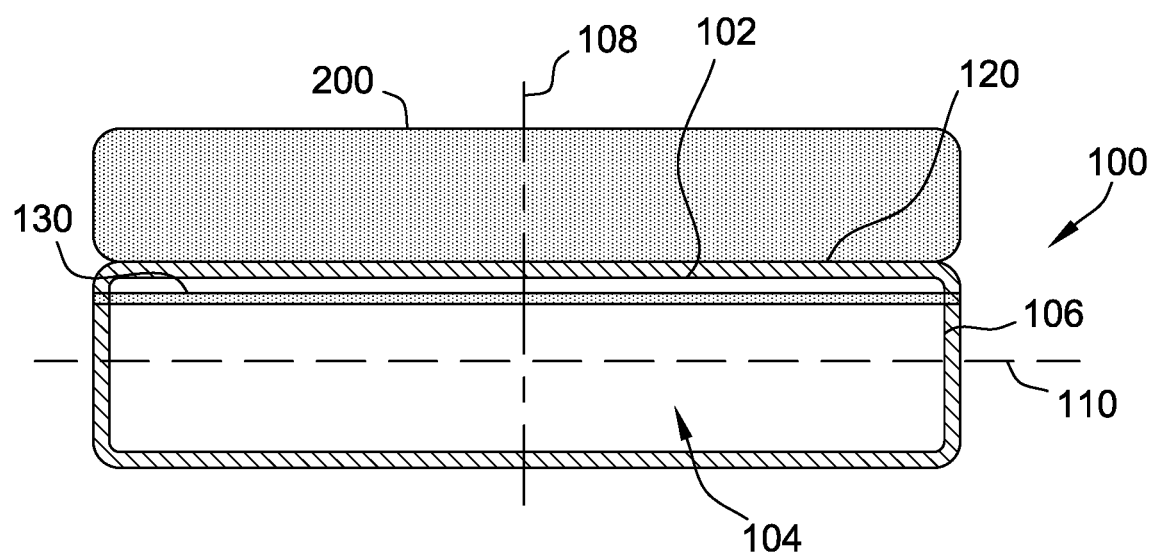
Figure 1F:
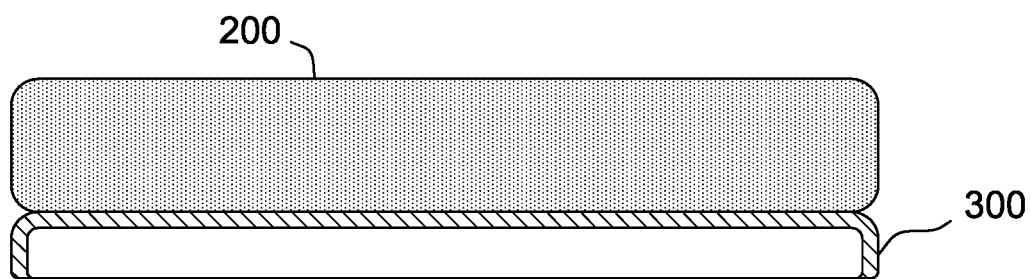

With reference to FIG. 1E, the oxidation layer 120 on the front surface 102 of the single crystal semiconductor donor substrate 100 having the cleave plane or damage layer 130 is next bonded to a major surface of a semiconductor handle substrate 200 by bringing these surfaces into intimate contact. In some embodiments, the semiconductor handle substrate 200 comprises a dielectric layer. The dielectric layer may comprise insulating materials selected from among silicon dioxide, silicon nitride, silicon oxynitride, hafnium oxide, titanium oxide, zirconium oxide, lanthanum oxide, barium oxide, and any combination thereof. In some embodiments, the dielectric layer comprises one or more insulating material selected from the group consisting of silicon dioxide, silicon nitride, silicon oxynitride, and any combination thereof. In some embodiments, the dielectric layer has a thickness of at least about 1 nanometer thick, or at least about 10 nanometers thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers. The dielectric layer may be between about 100 angstroms and about 1000 angstroms, such as between about 100 angstroms and about 700 angstroms, or between about 100 angstroms and about 500 angstroms, or between about 100 angstroms and about 250 angstroms. In some embodiments, the dielectric layer is much thinner, such as between about 5 angstroms and about 25 angstroms, such as between about 10 angstroms and about 15 angstroms.

In some embodiments, the dielectric layer may comprise one or more insulating layers, e.g., two insulating layers, three insulating layers, or more. Each insulating layer may comprise a material selected from the group consisting of silicon dioxide, silicon nitride, and siliconoxynitride. Each insulating layer may have a thickness of at least about 1 nanometer thick, or at least about 10 nanometers thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers.

Since the mechanical bond is relatively weak, in some embodiments, the bonded structure may be further annealed to solidify the bond between the single crystal semiconductor donor substrate 100 and the handle substrate 200. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 400° C., such as from about 300° C. to about 400° C. Thermal annealing may occur for a duration of from 10 minutes to about 10 hours, such as from about 10 minutes to 60 minutes.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by the "autocleave". This occurs when the pressure of the platelets at the implant plane exceeds the external isostatic pressure. Accordingly, conventional anneal may be limited to bonding temperatures between about 350° C. and about 400° C. because of autocleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as an autocleave or thermal cleave. It prevents higher temperature or longer time in the anneal. According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. Thermal annealing may occur for a duration of from about 0.5 hours to about 10 hour, such as between about 0.5 hours and about 3 hours, preferably a duration of about 2 hours. Thermal annealing within these temperatures ranges is sufficient to form a thermally activated cleave plane. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

After the thermal anneal, the bond between the single crystal semiconductor donor substrate 100 and the handle substrate 200 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 300, preferably a silicon device layer, on the semiconductor-on-insulator composite structure. See FIG. 1F. The method of the present invention enables the transfer of a thin layer of silicon from the donor substrate to the handle substrate. Accordingly, in some embodiments, the silicon layer has a thickness between about 500 Angstroms and about 2500 Angstroms.

After cleaving, the cleaved structure may be subjected to a high temperature anneal in order to further strengthen the bond between the transferred device layer 300 and the handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 2 to 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas.

In some embodiments, an epitaxial layer may be deposited on the transferred single crystal semiconductor device layer 300. A deposited epitaxial layer may comprise substantially the same electrical characteristics as the underlying single crystal semiconductor device layer 300. Alternatively, the epitaxial layer may comprise different electrical characteristics as the underlying single crystal semiconductor device layer 300. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from among boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers.

The finished SOI wafer may then be subjected to end of line metrology inspections and cleaned a final time using typical SC1-SC2 process.

The invention may be further illustrated by the following non-limiting Examples.

Example 1

Single crystal silicon donor substrates were subjected to ion implantation. First, the wafers were subjected to $He^+$ ion implantation at a dosage of $7 \times 10^{15}$ $cm^{-2}$. The implantation energy was 22 Kev. Thereafter, wafers were subjected to $H_2^+$ ion implantation or $H^+$ ion implantation. The $H_2^+$ ion implantation energy was 32 Kev. The $H^+$ ion implantation energy was 16 Kev. Dosages varied according to Table 1.

Stopping and range of ions in matter (SRIM) calculations show that the difference in the peak of $H^+$ and $He^+$ depth profiles is about 450 angstroms. See FIG. 1. The ion implanted donor substrates were bonded to handle substrates, annealed, and cleaved. Table 1 further provides the results of cleaving.

TABLE 1

Result of mechanical cleave operation for various $H_2^+$ and $H^+$ doses

| $H_2^+$ dose | $H^+$ dose | Cleave result |
|---|---|---|
| $3.1 \times 10^{15}$ $cm^{-2}$ | $6.8 \times 10^{15}$ $cm^{-2}$ | Did not cleave |
| | | Did not cleave |
| $3.7 \times 10^{15}$ $cm^{-2}$ | | Did not cleave |
| $4 \times 10^{15}$ $cm^{-2}$ | | Did not cleave |
| $4.3 \times 10^{15}$ $cm^{-2}$ | | Cleaved |
| $4.6 \times 10^{15}$ $cm^{-2}$ | | Cleaved |
| $4.9 \times 10^{15}$ $cm^{-2}$ | | Cleaved |
| $5.2 \times 10^{15}$ $cm^{-2}$ | | Cleaved |
| $5.5 \times 10^{15}$ $cm^{-2}$ | | Cleaved |
| $5.8 \times 10^{15}$ $cm^{-2}$ | | Cleaved |
| | $1.22 \times 10^{16}$ $cm^{-2}$ | Cleaved |
| $7.6 \times 10^{15}$ $cm^{-2}$ | | Cleaved |
| $7.9 \times 10^{15}$ $cm^{-2}$ | | Cleaved |
| $8.2 \times 10^{15}$ $cm^{-2}$ | | Cleaved |
| $8.5 \times 10^{15}$ $cm^{-2}$ | | Cleaved |
| $8.8 \times 10^{15}$ $cm^{-2}$ | | Cleaved |
| $9.1 \times 10^{15}$ $cm^{-2}$ | | Cleaved |
| $9.4 \times 10^{15}$ $cm^{-2}$ | | Cleaved |
| $9.7 \times 10^{15}$ $cm^{-2}$ | | Cleaved |
| | $2 \times 10^{16}$ $cm^{-2}$ | Cleaved |
| $1.03 \times 10^{16}$ $cm^{-2}$ | | Cleaved |

According to the results shown in Table 1, cleaving was not observed at $H_2^+$ ion implantation dosages of less than $4.3 \times 10^{15}$ $cm^{-2}$ or at $H^+$ ion implantation dosages of less than $6.8 \times 10^{15}$ $cm^{-2}$ in the event the $He^+$ ion implantation dosage is fixed at $7 \times 10^{15}$ $cm^{-2}$ at 22 Kev.

Figure 2:
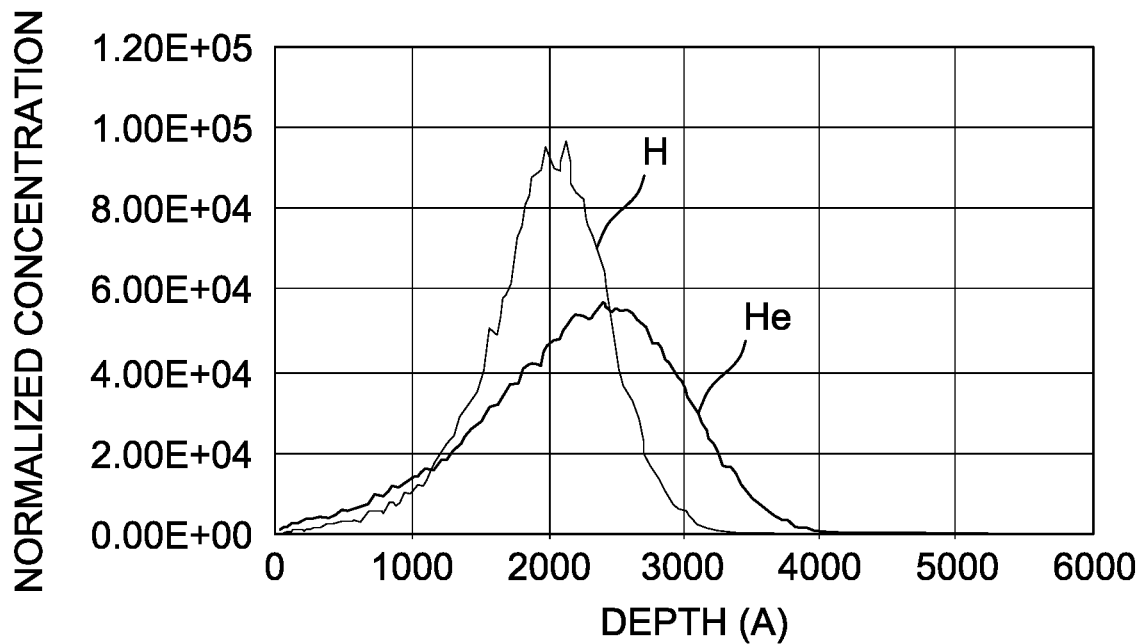
FIG. 2 is a graph depicting SRIM calculated depth profiles of $H^+$ and $He^+$ ions implanted at 16 Kev and 22 kev respectively. These data were obtained according to the method of Example 1.
Figure 3:
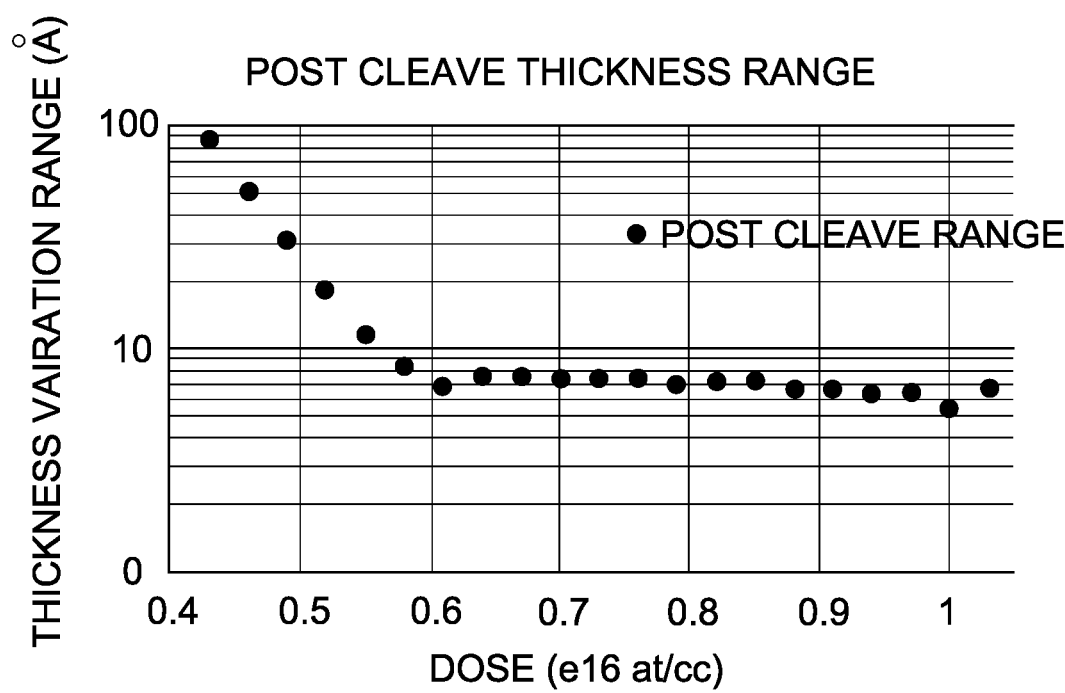
FIG. 3 is a graph depicting post cleave thickness variation ranges (*) of the transferred silicon device layer for various $H_2^+$ doses.

Post cleave, the thickness variation ranges of the transferred silicon device layers were measured as a function of $H_2^+$ ion implantation dosage. See FIG. 3, depicting post cleave thickness variation ranges (•) of the transferred silicon device layer for various $H_2^+$ doses. The data shown in FIGS. 2 and 3 enable determination that the minimal variation in the thickness of transferred silicon device layer is obtained when the $H_2^+$ ion implantation dosage is at least $6 \times 10^{15}$ $cm^{-2}$ in combination with a fixed $He^+$ ion implantation dosage of $7 \times 10^{15}$ $cm^{-2}$ at 22 Kev energy. Notably, the $H_2^+$ ion implantation dosage to minimize thickness variation of the transferred silicon device layer is significantly larger than that required to obtain cleave through mechanical cleave operation.

Example 2

Figure 4:
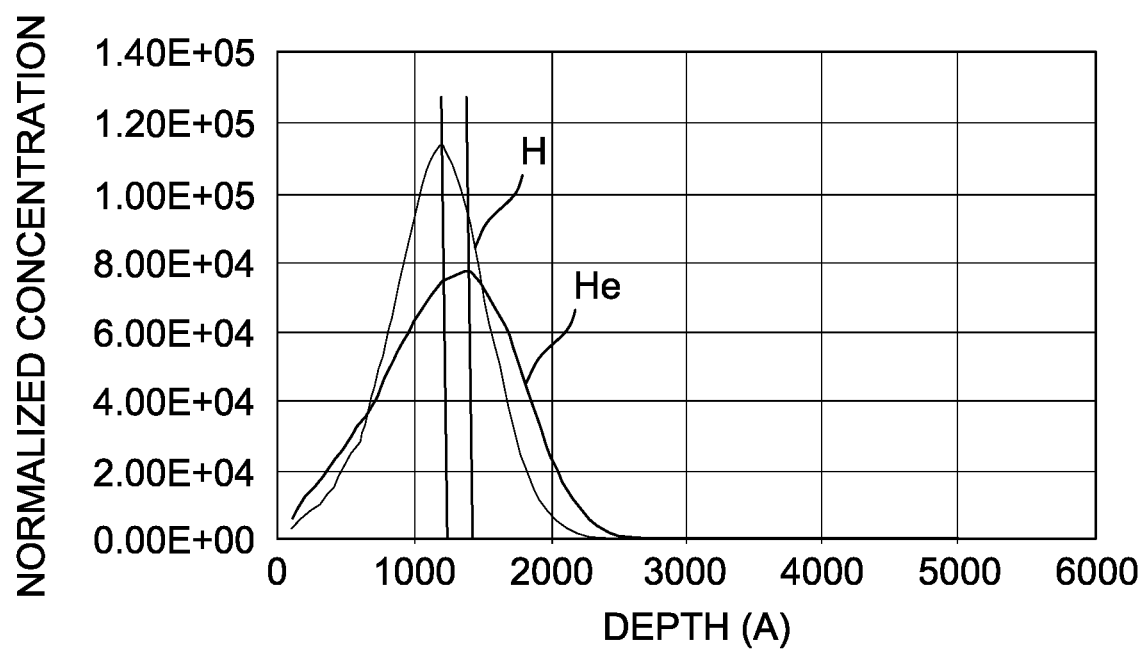
FIG. 4 is a graph depicting SRIM calculated depth profiles of $H^+$ and $He^+$ ions implanted at 8 Kev and 11 kev respectively. These data were obtained according to the method of Example 2.

Single crystal silicon donor substrates were subjected to ion implantation. Each wafer was subjected to ion implantation with $He^+$ ion and one of $H_2^+$ or $H^+$. The implant dosages for each of $He_+$, $H_2^+$ and $H^+$ were varied. The $He^+$ ion implantation dosage was varied between $6.6 \times 10^{15}$ $cm^{-2}$ to $7 \times 10^{15}$ $cm^{-2}$. The implantation energy of $He^+$ ion dosing was 11 Kev. The $H_2^+$ ion implantation energy was 16 Kev, and the $H^+$ ion implantation energy was 8 Kev. SRIM calculations show that the difference in the peak of $H^+$ and $He^+$ depth profiles is about 200 angstroms. See FIG. 4.

The ion implanted donor substrates were bonded to handle substrates, annealed, and cleaved. Table 1 further provides the results of cleaving.

TABLE 2

Result of mechanical cleave operation for various $H_2^+$ and $H^+$ doses

| $He^+$ dose | $H_2^+$ dose | $H^+$ dose | Cleave result |
|---|---|---|---|
| $7 \times 10^{15}$ cm$^{-2}$ | $6.7 \times 10^{15}$ cm$^{-2}$ | | Cleave with voids |
| $7 \times 10^{15}$ cm$^{-2}$ | | $6.8 \times 10^{15}$ cm$^{-2}$ | Did not cleave |
| $7 \times 10^{15}$ cm$^{-2}$ | $6.3 \times 10^{15}$ cm$^{-2}$ | | Cleave with voids |
| $7 \times 10^{15}$ cm$^{-2}$ | | $6.1 \times 10^{15}$ cm$^{-2}$ | Did not cleave |
| $7 \times 10^{15}$ cm$^{-2}$ | $5.9 \times 10^{15}$ cm$^{-2}$ | | Cleaved |
| $6.9 \times 10^{15}$ cm$^{-2}$ | $6.7 \times 10^{15}$ cm$^{-2}$ | | Cleave with voids |
| $6.9 \times 10^{15}$ cm$^{-2}$ | | $6.5 \times 10^{15}$ cm$^{-2}$ | Did not cleave |
| $6.9 \times 10^{15}$ cm$^{-2}$ | $6.3 \times 10^{15}$ cm$^{-2}$ | | Cleave with voids |
| $6.9 \times 10^{15}$ cm$^{-2}$ | | $6.1 \times 10^{15}$ cm$^{-2}$ | Did not cleave |
| $6.9 \times 10^{15}$ cm$^{-2}$ | $5.9 \times 10^{15}$ cm$^{-2}$ | | Partial cleave |
| $6.8 \times 10^{15}$ cm$^{-2}$ | $6.7 \times 10^{15}$ cm$^{-2}$ | | Cleaved |
| $6.8 \times 10^{15}$ cm$^{-2}$ | | $6.5 \times 10^{15}$ cm$^{-2}$ | Did not cleave |
| $6.8 \times 10^{15}$ cm$^{-2}$ | $6.3 \times 10^{15}$ cm$^{-2}$ | | Cleaved |
| $6.8 \times 10^{15}$ cm$^{-2}$ | | $6.1 \times 10^{15}$ cm$^{-2}$ | Did not cleave |
| $6.8 \times 10^{15}$ cm$^{-2}$ | $5.9 \times 10^{15}$ cm$^{-2}$ | | Cleaved |
| $6.7 \times 10^{15}$ cm$^{-2}$ | $6.7 \times 10^{15}$ cm$^{-2}$ | | Cleaved |
| $6.7 \times 10^{15}$ cm$^{-2}$ | | $6.5 \times 10^{15}$ cm$^{-2}$ | Did not cleave |
| $6.7 \times 10^{15}$ cm$^{-2}$ | $6.3 \times 10^{15}$ cm$^{-2}$ | | Cleaved |
| $6.7 \times 10^{15}$ cm$^{-2}$ | | $6.1 \times 10^{15}$ cm$^{-2}$ | Did not cleave |
| $6.7 \times 10^{15}$ cm$^{-2}$ | $5.9 \times 10^{15}$ cm$^{-2}$ | | Cleaved |
| $6.6 \times 10^{15}$ cm$^{-2}$ | $6.7 \times 10^{15}$ cm$^{-2}$ | | Cleaved |
| $6.6 \times 10^{15}$ cm$^{-2}$ | | $6.5 \times 10^{15}$ cm$^{-2}$ | Did not cleave |
| $6.6 \times 10^{15}$ cm$^{-2}$ | $6.3 \times 10^{15}$ cm$^{-2}$ | | Cleaved |
| $6.6 \times 10^{15}$ cm$^{-2}$ | | $6.1 \times 10^{15}$ cm$^{-2}$ | Did not cleave |
| $6.6 \times 10^{15}$ cm$^{-2}$ | $5.9 \times 10^{15}$ cm$^{-2}$ | | Cleaved |

At very low energies of $He^+$, namely 11 Kev, co-implantation of $H^+$ as low as $5.9 \times 10^{15}$ cm$^{-2}$ at 8 Kev can give successful mechanical cleave.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of transferring a silicon layer from a single crystal silicon donor substrate to a handle substrate, the method comprising:
    (a) implanting $H_2^+$ ions, $H^+$ ions, or a combination of $H_2^+$ ions and $H^+$ ions through a silicon dioxide layer in contact with a front surface of the single crystal silicon donor substrate and through the front surface of the single crystal silicon donor substrate, the single crystal silicon donor substrate comprising two major, parallel surfaces one of which is the front surface and one of which is the back surface, a circumferential edge joining the front surface and the back surface, a central plane between the front surface and the back surface, a central axis perpendicular to the front surface, and a bulk region between the front surface and the back surface, wherein the $H_2^+$ ions are implanted at a dosage between about $4.3 \times 10^{15}$ ions/cm$^2$ and about $1.1 \times 10^{16}$ ions/cm$^2$ at an implant energy between about 10 Kev and about 40 Kev and the $H^+$ ions are implanted at a dosage between about $5 \times 10^{15}$ ions/cm$^2$ and about $2 \times 10^{16}$ ions/cm$^2$ at an implant energy between about 5 Kev and about 20 Kev;
    (b) implanting $He^+$ ions through the silicon dioxide layer in contact with the front surface of a single crystal silicon donor substrate and through the front surface of the single crystal silicon donor substrate, wherein the $He^+$ ions are implanted at a dosage between about $6 \times 10^{15}$ ions/cm$^2$ and about $8 \times 10^{15}$ ions/cm$^2$ at an implant energy between about 5 Kev and about 30 Kev;
    (c) annealing the ion implanted single crystal silicon donor substrate at a temperature between about 200° C. and about 350° C. and for a duration sufficient to form a damage layer in the single crystal silicon donor substrate;
    (d) bonding the silicon dioxide layer in contact with the front surface of the single crystal silicon donor substrate to a dielectric layer in contact with the handle substrate to thereby prepare the multilayer substrate;
    (e) annealing the multilayer substrate at a temperature between about 200° C. and about 400° C. and for a duration sufficient to thermally activate the damage layer; and
    (f) cleaving the annealed multilayer substrate at the damage layer in the single crystal silicon donor substrate to thereby transfer the silicon layer having a thickness between about 500 Angstroms and about 2500 Angstroms from the single crystal silicon donor substrate to the handle substrate.

2. The method of claim 1 wherein step (a) occurs before step (b).

3. The method of claim 1 wherein step (b) occurs before step (a).

4. The method of claim 1 wherein steps (a) and (b) occur simultaneously.

5. The method of claim 1 wherein the single crystal donor substrate has a diameter between 150 mm and 450 mm.

6. The method of claim 1 wherein the silicon dioxide layer has a thickness between about 100 angstroms and about 1000 angstroms.

7. The method of claim 1 wherein the silicon dioxide layer has a thickness between about 5 angstroms and about 25 angstroms.

8. The method of claim 1 wherein step (a) comprises (i) implanting $H_2^+$ ions at a dosage between about $4.3 \times 10^{15}$ ions/cm$^2$ and about $1.1 \times 10^{16}$ ions/cm$^2$ at an implant energy between about 20 Kev and about 40 Kev, (ii) implanting $H^+$ ions at a dosage between about $5 \times 10^{15}$ ions/cm$^2$ and about $2 \times 10^{16}$ ions/cm$^2$ at an implant energy between about 5 Kev and about 20 Kev, or (iii) implanting $H_2^+$ ions at a dosage between about $4.3 \times 10^{15}$ ions/cm$^2$ and about $1.1 \times 10^{16}$ ions/cm$^2$ at an implant energy between about 20 Kev and about 40 Kev and implanting $H^+$ ions at a dosage between about $5 \times 10^{15}$ ions/cm$^2$ and about $2 \times 10^{16}$ ions/cm$^2$ at an implant energy between about 5 Kev and about 20 Kev.

9. The method of claim 8 wherein a peak density, (D1), of $H_2^+$ ions, $H^+$ ions, or a combination of $H_2^+$ ions and $H^+$ ions is between about 100 Angstroms and about 3000 Angstroms as measured from the front surface of the single crystal silicon donor substrate and along the central axis.

10. The method of claim 1 wherein step (b) comprises implanting He$^+$ ions at a dosage between about $6\times10^{15}$ ions/cm$^2$ and about $8\times10^{15}$ ions/cm$^2$ at an implant energy between about 10 Kev and about 25 Kev.

11. The method of claim 10 wherein a peak density, (D2), of He$^+$ ions is between about 100 Angstroms and about 4000 Angstroms as measured from the front surface of the single crystal silicon donor substrate and along the central axis.

12. The method of claim 8 wherein the peak density, (D1), of H$_2^+$ ions, H$^+$ ions, or a combination of H$_2^+$ ions and H$^+$ ions and the peak density, (D2), of He$^+$ ions are within about 600 angstroms of each other.

13. The method of claim 8 wherein step (c) comprises annealing the ion implanted single crystal silicon donor substrate at a temperature between about 250° C. and about 300° C. for a duration between 10 minutes and 60 minutes.

14. The method of claim 8 wherein step (e) comprises annealing the ion implanted single crystal silicon donor substrate at a temperature between about 300° C. and about 400° C. for a duration between 10 minutes and 60 minutes.

15. The method of claim 8 wherein the silicon layer having the thickness between about 500 Angstroms and about 2500 Angstroms transferred from the single crystal silicon donor substrate to the handle substrate has a thickness variation less than about 10 angstroms.

16. The method of claim 1 wherein step (a) comprises (i) implanting H$_2^+$ ions at a dosage between about $6\times10^{15}$ ions/cm$^2$ and about $1.1\times10^{16}$ ions/cm$^2$, at an implant energy between about 20 Kev and about 40 Kev, (ii) implanting H$^+$ ions at a dosage between about $1.1\times10^{16}$ ions/cm$^2$ and about $2\times10^{16}$ ions/cm$^2$ at an implant energy between about 5 Kev and about 20 Kev, or (iii) implanting H$_2^+$ ions at a dosage between about $6\times10^{15}$ ions/cm$^2$ and about $1.1\times10^{16}$ ions/cm$^2$, at an implant energy between about 20 Kev and about 40 Kev and implanting H$^+$ ions at a dosage between about $1.1\times10^{16}$ ions/cm$^2$ and about $2\times10^{16}$ ions/cm$^2$ at an implant energy between about 5 Kev and about 20 Kev.

17. The method of claim 16 wherein a peak density, (D1), of H$_2^+$ ions, H$^+$ ions, or a combination of H$_2^+$ ions and H$^+$ ions is between about 100 Angstroms and about 3000 Angstroms as measured from the front surface of the single crystal silicon donor substrate and along the central axis.

18. The method of claim 16 wherein step (b) comprises implanting He$^+$ ions at a dosage between about $6\times10^{15}$ ions/cm$^2$ and about $8\times10^{15}$ ions/cm$^2$ at an implant energy between about 10 Kev and about 30 Kev.

19. The method of claim 18 wherein a peak density, (D2), of He$^+$ ions is between about 100 Angstroms and about 4000 Angstroms as measured from the front surface of the single crystal silicon donor substrate and along the central axis.

20. The method of claim 16 wherein the peak density, (D1), of H$_2^+$ ions, H$^+$ ions, or a combination of H$_2^+$ ions and H$^+$ ions and the peak density, (D2), of He$^+$ ions are within about 600 angstroms of each other.

21. The method of claim 16 wherein step (c) comprises annealing the ion implanted single crystal silicon donor substrate at a temperature between about 250° C. and about 300° C. for a duration between 10 minutes and 60 minutes.

22. The method of claim 16 wherein step (e) comprises annealing the ion implanted single crystal silicon donor substrate at a temperature between about 300° C. and about 400° C. for a duration between 10 minutes and 60 minutes.

23. The method of claim 16 wherein the silicon layer having the thickness between about 500 Angstroms and about 2500 Angstroms transferred from the single crystal silicon donor substrate to the handle substrate has a thickness variation less than about 10 angstroms.

24. The method of claim 1 wherein step (b) comprises implanting He$^+$ ions at a dosage between about $6.6\times10^{15}$ ions/cm$^2$ and about $7\times10^{15}$ ions/cm$^2$ at an implant energy between about 5 Kev and about 20 Kev.

25. The method of claim 24 wherein a peak density, (D2), of He$^+$ ions is between about 100 Angstroms and about 4000 Angstroms as measured from the front surface of the single crystal silicon donor substrate and along the central axis.

26. The method of claim 24 wherein step (a) comprises (i) implanting H$_2^+$ ions at a dosage between about $5.9\times10^{15}$ ions/cm$^2$ and about $6.7\times10^{15}$ ions/cm$^2$ at an implant energy between about 10 Kev and about 30 Kev, (ii) implanting H$^+$ ions at a dosage between about $6.1\times10^{15}$ ions/cm$^2$ and about $6.8\times10^{15}$ ions/cm$^2$ at an implant energy between about 5 Kev and about 20 Kev, or (iii) implanting H$_2^+$ ions at a dosage between about $5.9\times10^{15}$ ions/cm$^2$ and about $6.7\times10^{15}$ ions/cm$^2$ at an implant energy between about 10 Kev and about 30 Kev and implanting H$^+$ ions at a dosage between about $6.1\times10^{15}$ ions/cm$^2$ and about $6.8\times10^{15}$ ions/cm$^2$ at an implant energy between about 5 Kev and about 20 Kev.

27. The method of claim 24 wherein a peak density, (D1), of H$_2^+$ ions, H$^+$ ions, or a combination of H$_2^+$ ions and H$^+$ ions is between about 100 Angstroms and about 3000 Angstroms as measured from the front surface of the single crystal silicon donor substrate and along the central axis.

28. The method of claim 24 wherein the peak density, (D1), of H$_2^+$ ions, H$^+$ ions, or a combination of H$_2^+$ ions and H$^+$ ions and the peak density, (D2), of He$^+$ ions are within about 600 angstroms of each other.

29. The method of claim 24 wherein step (c) comprises annealing the ion implanted single crystal silicon donor substrate at a temperature between about 250° C. and about 300° C. for a duration between 10 minutes and 60 minutes.

30. The method of claim 24 wherein step (e) comprises annealing the ion implanted single crystal silicon donor substrate at a temperature between about 300° C. and about 400° C. for a duration between 10 minutes and 60 minutes.

31. The method of claim 24 wherein the silicon layer having the thickness between about 500 Angstroms and about 2500 Angstroms transferred from the single crystal silicon donor substrate to the handle substrate has a thickness variation less than about 10 angstroms.

* * * * *